(12) United States Patent
Ibrahim et al.

(10) Patent No.: US 7,840,202 B2
(45) Date of Patent: *Nov. 23, 2010

(54) METHOD AND SYSTEM FOR COMPENSATION OF DC OFFSET IN AN RF RECEIVER

(75) Inventors: Brima Ibrahim, Aliso Viejo, CA (US); Hea Joung Kim, Irvine, CA (US); Hooman Darabi, Irvine, CA (US)

(73) Assignee: Broadcom Corp.

( * ) Notice: Subject to any disclaimer, the term of this patent is extended or adjusted under 35 U.S.C. 154(b) by 69 days.

This patent is subject to a terminal disclaimer.

(21) Appl. No.: 12/268,957

(22) Filed: Nov. 11, 2008

(65) Prior Publication Data

US 2009/0066548 A1    Mar. 12, 2009

Related U.S. Application Data

(63) Continuation of application No. 10/987,977, filed on Nov. 12, 2004, now Pat. No. 7,593,707.

(60) Provisional application No. 60/624,013, filed on Nov. 1, 2004.

(51) Int. Cl.
    *H04B 1/06*    (2006.01)
(52) U.S. Cl. .................... 455/260; 455/324; 455/340; 375/327

(58) Field of Classification Search .......... 455/255–260, 455/313, 323, 324, 334, 339–341; 375/319, 375/324, 327, 343, 349, 350
See application file for complete search history.

(56) References Cited

U.S. PATENT DOCUMENTS

| 5,251,033 | A | 10/1993 | Anderson et al. |
| 5,550,869 | A | 8/1996 | Gurantz et al. |
| 5,999,561 | A | 12/1999 | Naden et al. |
| 6,208,701 | B1 | 3/2001 | Hiramatsu et al. |
| 7,215,722 | B2 * | 5/2007 | Hsiao .......................... 375/319 |
| 7,593,707 | B2 * | 9/2009 | Ibrahim et al. .............. 455/260 |
| 2002/0160734 | A1 | 10/2002 | Li et al. |
| 2005/0207517 | A1 * | 9/2005 | Qin ............................ 375/344 |

* cited by examiner

*Primary Examiner*—Nhan Le
(74) *Attorney, Agent, or Firm*—McAndrews, Held & Malloy, Ltd.

(57) ABSTRACT

System and method for processing signals are disclosed. The method may include converting, in an RF receiver, one or more analog samples, which are selected from one of a plurality of output paths of the RF receiver, to one or more digital samples. A digital feedback value may be generated based on an average of the one or more converted digital samples. A scaled version of the generated digital feedback value may be converted to an analog value. The converted analog value may be fed back to one or more of a plurality of input paths of the RF receiver. The one or more analog samples may be selected from among a plurality of output analog samples from the plurality of output paths of the RF receiver.

22 Claims, 7 Drawing Sheets

METHOD AND SYSTEM FOR COMPENSATION OF DC OFFSET IN AN RF RECEIVER

CROSS-REFERENCE TO RELATED APPLICATIONS/INCORPORATION BY REFERENCE

This application is a continuation of U.S. application Ser. No. 10/987,977 filed Nov. 12, 2004, which in turn makes reference to, claims priority to and claims the benefit of U.S. Provisional Application Ser. No. 60/624,013 filed Nov. 1, 2004.

This application makes reference to:

U.S. application Ser. No. 10/134,797 entitled "Radio receiver having direct DC offset compensation" filed Apr. 29, 2004;

U.S. Provisional Patent Application Ser. No. 60/623,963 filed Nov. 1, 2004;

U.S. Provisional Patent Application Ser. No. 60/623,962 filed Nov. 1, 2004;

U.S. Provisional Patent Application Ser. No. 60/624,012 filed Nov. 1, 2004;

U.S. Provisional Patent Application Ser. No. 60/624,011 filed Nov. 1, 2004;

U.S. Provisional Patent Application Ser. No. 60/624,019 filed Nov. 1, 2004; and

U.S. Provisional Patent Application Ser. No. 60/623,956 filed Nov. 1, 2004.

The above stated applications are hereby incorporated herein by reference in their entirety.

FIELD OF THE INVENTION

Certain embodiments of the invention relate to processing received RF signals. More specifically, certain embodiments of the invention relate to a method and system for compensation of DC offset in an RF receiver.

BACKGROUND OF THE INVENTION

In some conventional systems, a radio frequency (RF) signal may be converted to an intermediate frequency (IF), and then from IF to a baseband signal, where the IF may be in the megahertz range. Generally, the RF signal may be mixed with a local oscillator signal that results in two (double) sideband signals that are the sum of the frequencies of the two signals and the difference of the frequencies of the two signals. One of the two sideband signals may be chosen as an IF signal, and this IF signal may be the same for all received RF signals. Therefore, a radio that may receive a plurality of channels, such as an AM or FM radio, may tune to a particular station by changing the local oscillator signal frequency such that the IF remains constant. With a constant IF, most of the receive path may be common in the receiver.

Today, much of radio receiver development may be driven mostly by a great demand for mobile wireless communication devices, including handsets. With the ever-decreasing size of mobile handsets, capacities of smaller batteries may be an issue. As most of these handsets may utilize complementary metal-oxide semiconductor (CMOS) technology for analog-to-digital conversion, and for much of the processing of voice and data signals, a very important factor to consider is that it may be advantageous for CMOS devices to operate at lower frequencies. This may be crucial since CMOS devices have power dissipation directly related to the speed at which the CMOS devices switch. The faster the frequencies, the faster the CMOS device switching speed, and therefore, the greater the amount of power consumed. Therefore, receivers may be designed to downconvert the high frequency RF, which may be in gigahertz range, to a lower frequency, preferably to a baseband frequency, as quickly as possible.

Another important factor to consider may be the signal integrity in the signal path. Because signals received at a receiver's antenna may be very weak, for example, six millivolts (6 mV), the first component to process the received signal may be a low noise amplifier (LNA) that is designed to amplify signals while adding very little additional noise to the signal being amplified. The amplified signal may be filtered to attenuate undesired signals, amplified further to increase the strength of the signal, and mixed with local oscillator signals to downconvert to lower frequencies. Factors such as process, voltage and temperature (PVT) variations may also result in a DC offset.

The DC offset may result from different sources, for example, from device mismatch within a receiver and/or from interference from other received signals. Generally, a time-invariant DC offset due to device mismatch may be cancelled at a factory where the receiver is manufactured. However, there may be very slowly time-varying DC offset due to interference from other signals. This type of DC offset cannot be cancelled at the time of manufacture since effects of the interference signals may vary over time during operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for compensation of DC offset in an RF receiver. Aspects of the method may comprise sampling data from at least one of a plurality of output paths and selecting the sampled data to generate at least one feedback signal based on the selected sampled data. The generated at least one feedback signal may be fed back to at least one of a plurality of input paths, and at least one of the feedback signals may be of an opposite polarity to the selected sampled data. A gain of the sampled data may be adjusted before the signal is fed back.

The method may further comprise converting the selected sampled data to a digital sample, accumulating a plurality of the digital samples, and calculating an average of the plurality of the digital samples. A digital feedback value may then be generated based on the average of the plurality of digital samples. A phase of the digital feedback value may be adjusted via a derotator, which may utilize coordinate rotation digital computer (CORDIC) algorithm. The digital feedback value may be scaled for input to one of a plurality of digital-to-analog converters, and an output of the at least one of a plurality of digital-to-analog converters may be fed back to the at least one of a plurality of input paths.

Aspects of the system for handling DC offset in an RF receiver may comprise a plurality of output paths, wherein sampled data may be selected from at least one of the plurality of output paths. At least one feedback signal may be generated based on the selected sampled data. The system may also comprise a plurality of input paths, and the generated feedback signal may be fed back to at least one of the plurality of input paths. A gain of the sampled data may be adjusted before the signal is fed back. At least one feedback signal that is of an opposite polarity to the selected sampled data may be fed back. The selected sampled data may be converted to a digital sample, and a plurality of the digital samples may be accumulated. An average of the plurality of the digital samples may then be calculated and a digital feedback value may be generated based on the calculated average of the plurality of digital samples.

The system may further comprise a derotator that is adapted to adjust a phase of the digital feedback value. The derotator may be configured to utilize coordinate rotation digital computer (CORDIC) algorithm. The system may additionally comprise a plurality of digital-to-analog converters, and the digital feedback value may be scaled for input to one of the plurality of digital-to-analog converters. An output of at least one of the plurality of digital-to-analog converters may be fed back to the at least one of a plurality of input paths.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for compensation of DC offset in an RF receiver. Various aspects of the invention may be utilized in a, for example, mobile communication handset, which may be adapted to receive RF signals and downconvert the received RF signals to a very low intermediate frequency (VLIF) signal. The VLIF signal may be further downconverted to a baseband signal. The process of downconverting a received signal to a baseband signal may comprise amplifying the received signals. However, if the DC offset is too large, the amplifier may saturate and information in the signal may be lost or distorted. Hence, an analog-to-digital converter (ADC) may be unable to accurately convert the amplified signal to a corresponding digital representation of the signal.

In mobile communications, some receivers, for example, a mobile communication handsets, may vary in position with respect to a transmitter, for example, a cellular base station, which may be transmitting at a relatively constant power. The gain of amplifiers in the mobile communication receiver may need to be adjusted constantly in order to avoid saturating the amplifiers. Therefore, it may be necessary to sample the received signal multiple times within a received packet in order to maximize signal integrity. Therefore, it may be necessary to vary a gain of a received signal to prevent saturation. Additionally, many communication systems utilize I-channel and Q-channel to transmit data. However, although a receiver may separate a received signal to separate I-channel and Q-channel signals, non-ideal components utilized in the receiver may allow some I-channel signal in the Q-channel, and vice versa. This may cause undesired phase shift in the individual I-channel and Q-channel. Accordingly, an embodiment of the invention may utilize closed-loop and/or open-loop feedback loops to reduce DC offset, adjust amplifier gain, and reduce undesired phase shift in the I-channel and Q-channel signals.

Figure 1B:
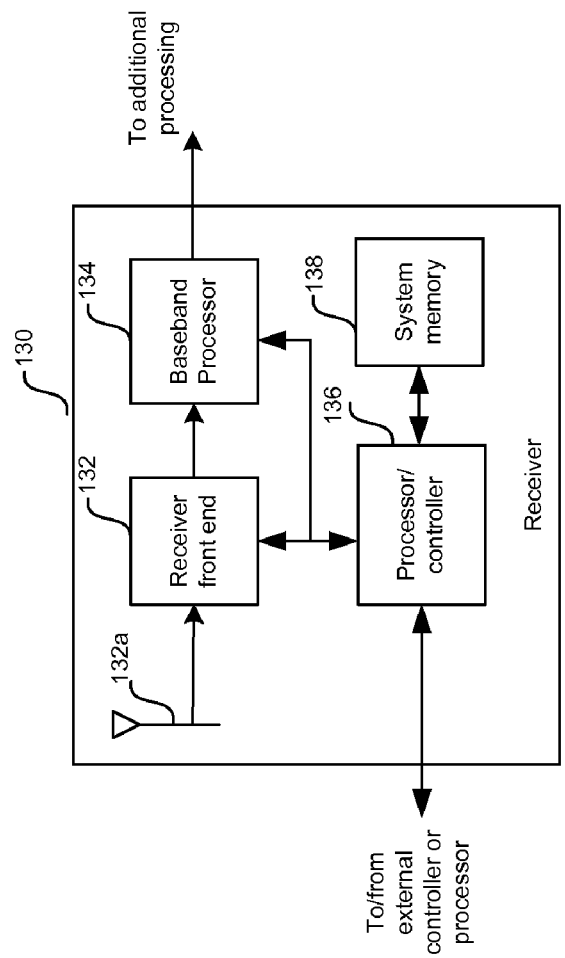
FIG. 1b is a block diagram of an exemplary RF receiver block such as the receiver block of FIG. 1a, in accordance with an embodiment of the invention.
Figure 1A:
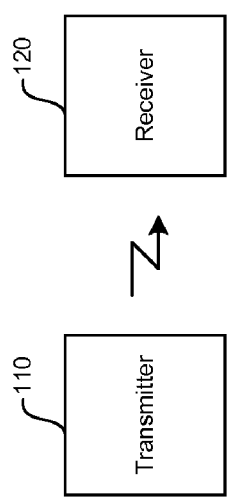
FIG. 1a is a block diagram of an exemplary transmitter block and a receiver block that may be utilized in connection with an embodiment of the invention.

FIG. 1a is a block diagram of an exemplary transmitter block and a receiver block that may be utilized in connection with an embodiment of the invention. Referring to FIG. 1a, there is shown a transmitter block 110 and a receiver block 120. The transmitter block 110 may comprise suitable logic, circuitry, and/or code that may be adapted to filter and modulate a baseband signal to an RF signal, and transmit the RF signal. The receiver block 120 may comprise suitable logic, circuitry, and/or code that may be adapted to demodulate the RF signal to the baseband signal.

In operation, the transmission block 110 may be adapted to transmit RF signals over a wired or wireless medium. The receiver block 120 may be adapted to receive the RF signals and process them so as to generate baseband signals that may be suitable for further processing, for example, as data or voice.

FIG. 1b is a block diagram of an exemplary RF receiver block such as the receiver block of FIG. 1a, in accordance with an embodiment of the invention. Referring to FIG. 1b, the RF receiver block 130 may comprise an antenna 132a, a receiver front end 132, a baseband processor 134, a controller/processor 136, and a system memory 138. The receiver front end (RFE) 132 may comprise suitable logic, circuitry, and/or code that may be adapted to receive an RF signal. The RFE 132 may be coupled to an external antenna 132a for signal reception. The RFE 132 may demodulate a received signal before further processing. Moreover, the RFE 132 may be adapted to execute other functions, for example, filtering the received signal, amplifying the received signal and/or downconverting the received signal to VLIF signal and/or baseband signal.

The baseband processor 134 may comprise suitable logic, circuitry, and/or code that may be adapted to process received baseband signals from the RFE 132. The controller/processor 136 may comprise suitable logic, circuitry, and/or code that may be adapted to control the operations of the RFE 132 and/or the baseband processor 134. For example, the controller/processor 136 may be utilized to update and/or modify programmable parameters and/or values in a plurality of components, devices, and/or processing elements in the RFE 132 and/or the baseband processor 134. Control and/or data information, which may include the programmable parameters, may be transferred from at least one controller and/or processor external to the RF receiver block 120 (FIG. 1a) to the controller/processor 136. Similarly, the controller/processor 136 may be adapted to transfer control and/or data information, which may include the programmable parameters, to at least one controller and/or processor, which may be externally coupled to the RF receiver block 120.

The controller/processor 136 may utilize the received control and/or data information, which may comprise the programmable parameters, to determine an operating mode of the RFE 132. For example, the controller/processor 136 may select a specific frequency for a local oscillator, or a specific gain for a variable gain amplifier. Moreover, the specific frequency selected and/or parameters needed to calculate the specific frequency, and/or the specific gain value and/or the parameters needed to calculate the specific gain, may be stored in the system memory 138 via the controller/processor 136. This information stored in system memory 138 may be transferred to the RFE 132 from the system memory 138 via the controller/processor 136. The system memory 138 may comprise suitable logic, circuitry, and/or code that may be adapted to store a plurality of control and/or data information, including parameters needed to calculate frequencies and/or gain, and/or the frequency value and/or gain value.

Figure 2:
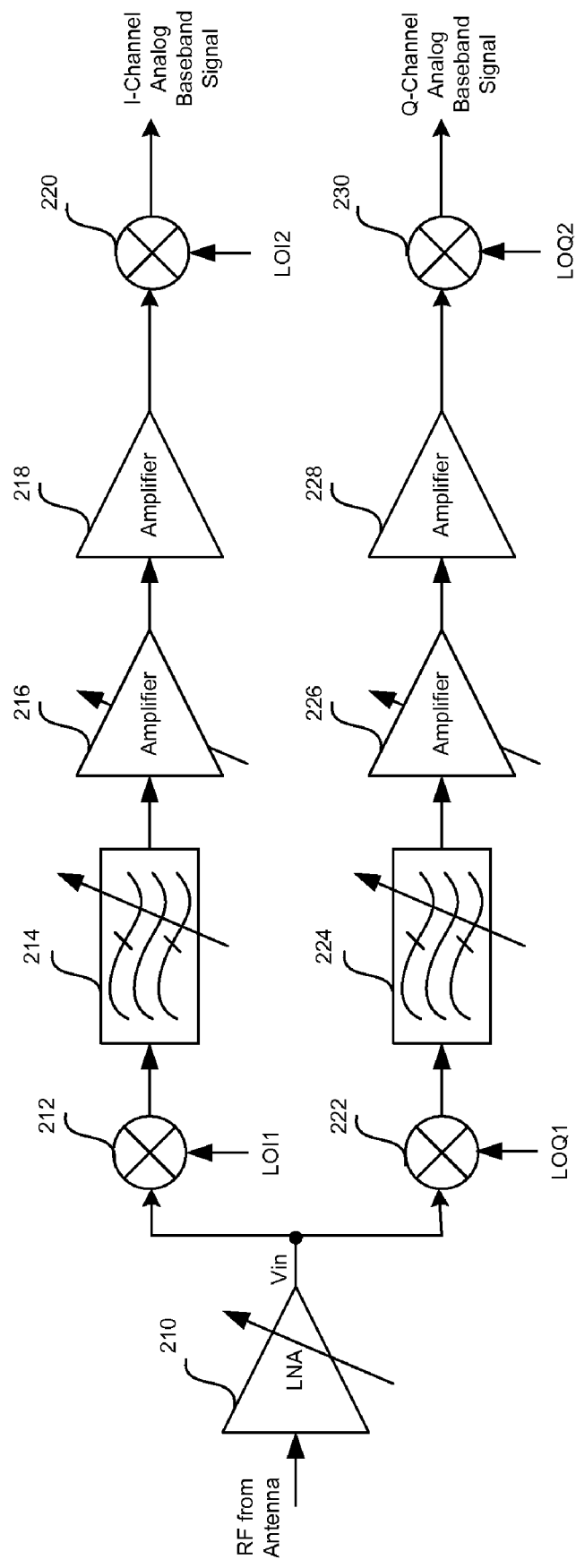
FIG. 2 is a block diagram illustrating an exemplary RF receiver front end (RFE) such as, for example, the RFE of FIG. 1b, which may extract an analog baseband signal, in accordance with an embodiment of the invention.

FIG. 2 is a block diagram illustrating an exemplary RF receiver front end (RFE) such as, for example, the RFE of FIG. 1b, which may extract an analog baseband signal, in accordance with an embodiment of the invention. Referring to FIG. 2, there is shown a low noise amplifier (LNA) 210, mixers 212, 222, 220 and 230, bandpass filters 214 and 224, programmable gain amplifiers (PGA) 216 and 226, and amplifiers 218 and 228. The LNA 210 may comprise suitable logic, circuitry, and/or code that may be adapted to amplify input signals and output the amplified signals. The LNA 210 may be utilized in instances where the signal to noise ratio (SNR) may be relatively low, such as, for example, RF signals received by an antenna.

The mixers 212, 222, 220 and 230 may comprise suitable logic, circuitry, and/or code that may be adapted to have as inputs two signals, and generate one or more output signals. The output signal generated may comprise a difference of the frequencies of the two input signals and/or a sum of the frequencies of the two input signals.

The bandpass filters 214 and 224 may comprise suitable logic, circuitry, and/or code that may be adapted to selectively pass signals within a certain bandwidth while attenuating signals outside that bandwidth. The bandpass filters 214 and 224 may further comprise an amplifier circuit that may be utilized to amplify the bandpass filtered signal by adjusting a gain of the input signal. The gain of the amplifier circuit may be controlled by a processor, such as, for example, the baseband processor 134 (FIG. 1b) or a processor/controller 136 (FIG. 1b). In this regard, the gain may be controlled externally and/or internally.

The PGAs 216 and 226 may comprise suitable logic, circuitry, and/or code that may be adapted to amplify a gain of the input signals and generate resulting output amplified signals. The gain of the amplifiers 216 and 226 may be controlled by a processor, such as, for example, a baseband processor 134 (FIG. 1b) or a processor/controller 136 (FIG. 1b). In this regard, the gain may be controlled externally and/or internally. The gain of the PGAs 216 and 226 may be as high as, for example, 15 dB.

The amplifiers 218 and 228 may comprise suitable logic, circuitry, and/or code that may be adapted to amplify input signals and output the amplified signals. The amplifiers 218 and 228 may be fixed gain amplifiers, and the gain may be fixed, for example, at 15 dB.

In operation, the RF signal, which may have a carrier frequency $f_{RF}$, may be received by the antenna 132a (FIG. 1b) and communicated to the LNA 210, where the RF signal may be amplified by the LNA 210. The amplified RF signal may be communicated to separate I-channel path and Q-channel path, and first components in the two paths may be the mixers 212 and 222, respectively. The mixers 212 and 222 may mix the amplified RF signal with local oscillator signals LOI1 and LOQ1, respectively. The outputs of the mixers 212 and 222 may be IF in-phase (I) and quadrature (Q) signals, respectively, and these signals may be at an intermediate frequency. However, since the mixers 212 and 222 may not be able to completely separate all IF I component signals from all IF Q component signals, there may be some IF Q component signal in the IF I component signal in the I-channel path, and there may be some IF I component signal in the IF Q component signal in the Q-channel path. The result may be that the IF I component signal in the I-channel path may have an undesired phase shift due to the IF Q component signal, and the IF Q component signal in the Q-channel path may have an undesired phase shift due to the IF I component signal.

The IF I component signal and the IF Q component signal may be communicated to bandpass filters 214 and 224, which may be adapted to pass the desired bandwidth of signals about the IF frequency, while attenuating the undesired frequencies in the IF signal. The bandpass filters 214 and 224 and may be adapted to amplify the desired bandwidth of the IF I component and/or IF Q component signals. The filtered and amplified IF I component and IF Q component signals may be communicated to the PGAs 216 and 226, and these signals may be amplified. The gain of the amplifier may be controlled by a processor, for example, a baseband processor 134 (FIG. 1b) or a processor/controller 136 (FIG. 1b). Amplified IF I component and IF Q component signals from the bandpass filters 214 and 224 may be communicated to the amplifiers 218 and 228. The IF I component and IF Q component signals may be further amplified. The IF I component signal at the output of the amplifier 218 may be communicated to an input of the mixer 220, and the IF Q component signal at the output of the amplifier 228 may be communicated to an input of the mixer 230. The mixers 220 and 230 may further receive as inputs local oscillator signals LOI2 and LOQ2, respectively. The respective inputs at each mixer 220 and 230 may be mixed by the mixers 220 and 230, respectively, resulting in I-channel analog baseband signal and Q-channel analog baseband signal, respectively.

Figure 3:
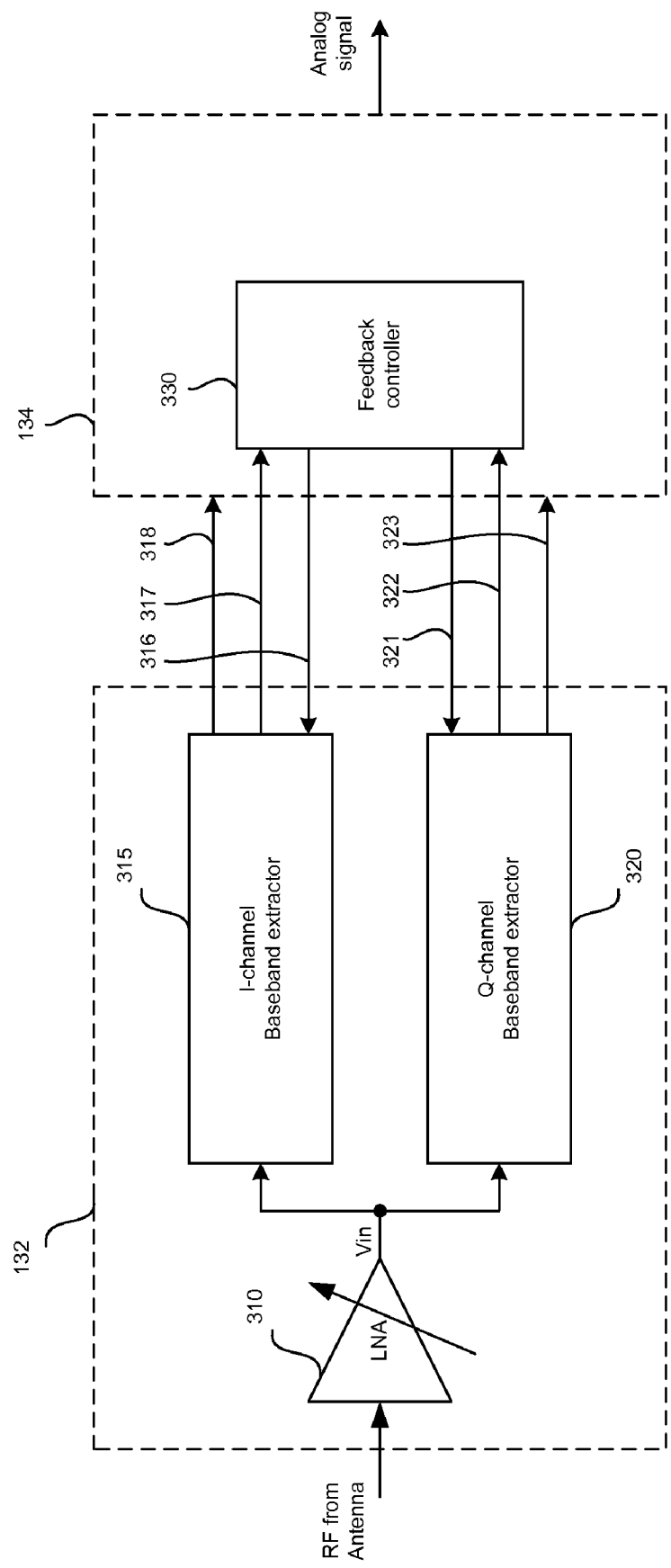
FIG. 3 is a block diagram illustrating an exemplary RF receiver front end and an exemplary baseband controller, in accordance with an embodiment of the invention.

FIG. 3 is a block diagram illustrating an exemplary RF receiver front end and an exemplary baseband controller, in accordance with an embodiment of the invention. Referring to FIG. 3, there is shown a receiver front end (RFE) 300 and a baseband processor 305. The RFE 300 may comprise a low noise amplifier (LNA) 310, similar to the LNA 210 (FIG. 2), an I-channel baseband extractor (ICBE) 315, and a Q-channel baseband extractor (QCBE) 320. The ICBE 315 may comprise mixers 212 and 220, bandpass filter 214, amplifiers 216 and 218 as shown in FIG. 2, and may be adapted to downconvert an RF signal to a baseband signal, as described with respect to FIG. 2. In accordance with an embodiment of the invention, the ICBE 315 may utilize a feedback loop to reduce DC offset. Similarly, the QCBE 320 may comprise mixers 222 and 230, bandpass filter 224, amplifiers 226 and 228 as shown in FIG. 2, and may be adapted to downconvert an RF signal to a baseband signal, as described with respect to FIG. 2. The QCBE 320 may also utilize a feedback loop to reduce DC offset.

The baseband processor 305 may be somewhat similar to the baseband processor 134 described with respect to FIG. 1. Notwithstanding, the baseband processor may comprise a feedback controller 330. The feedback controller 330 may comprise suitable logic, circuitry, and/or code that may be adapted to control various feedback processes to remove DC offset and/or phase shift in the signals being processed by the ICBE 315 and the QCBE 320. The feedback controller 330 may comprise a state machine that may be adapted to control various feedback functionalities, for example, operation of analog-to-digital converters and digital-to-analog converters. The phase shifts in IF I component signal in the ICBE 315 and/or in IF Q component signal in the QCBE 320 may be digitally adjusted by a derotation unit, adapted for that purpose, in the feedback controller 330. The derotation unit may utilize a coordinate rotation digital computer (CORDIC) algorithm.

In operation, the LNA 310 may receive an RF signal from the antenna 132a (FIG. 1b) and amplify the RF signal, and communicate the amplified RF signal to the ICBE 315 and the QCBE 320. The ICBE 315 may amplify, filter and downconvert the amplified RF signal $S_{in}$, and may also communicate analog samples 317 from various points of the ICBE 310 to the feedback controller 330. For example, the analog samples 317 may be from the output of the mixers 212 and/or 214, and/or the output of the bandpass filter 214, and/or the output or the amplifier 216 and/or 218. The feedback controller 330 may convert the analog samples 317 to digital samples, process the digital samples appropriately for reducing the DC offset and convert the resulting digital values to analog feedback signals that may be communicated to the ICBE 315 via data/control signal 316. The analog feedback signals may be communicated to various points in the ICBE 315 to reduce the DC offset. For example, the analog feedback signals may be communicated to the input of the bandpass filter 214, and/or to the inputs of the amplifiers 216 and/or 218. Similarly, the QCBE 320 may communicate analog samples 322 to the feedback controller 330, and receive feedback signals via data/control signal 321. The ICBE 315 and the QCBE 320 may generate outputs that may be I-channel analog baseband signal (ICABS) 318 and a Q-channel analog baseband signal (QCABS) 323, respectively. ICABS 318 and QCABS 323 may be communicated to the baseband processor 305 for further processing.

Figure 4:
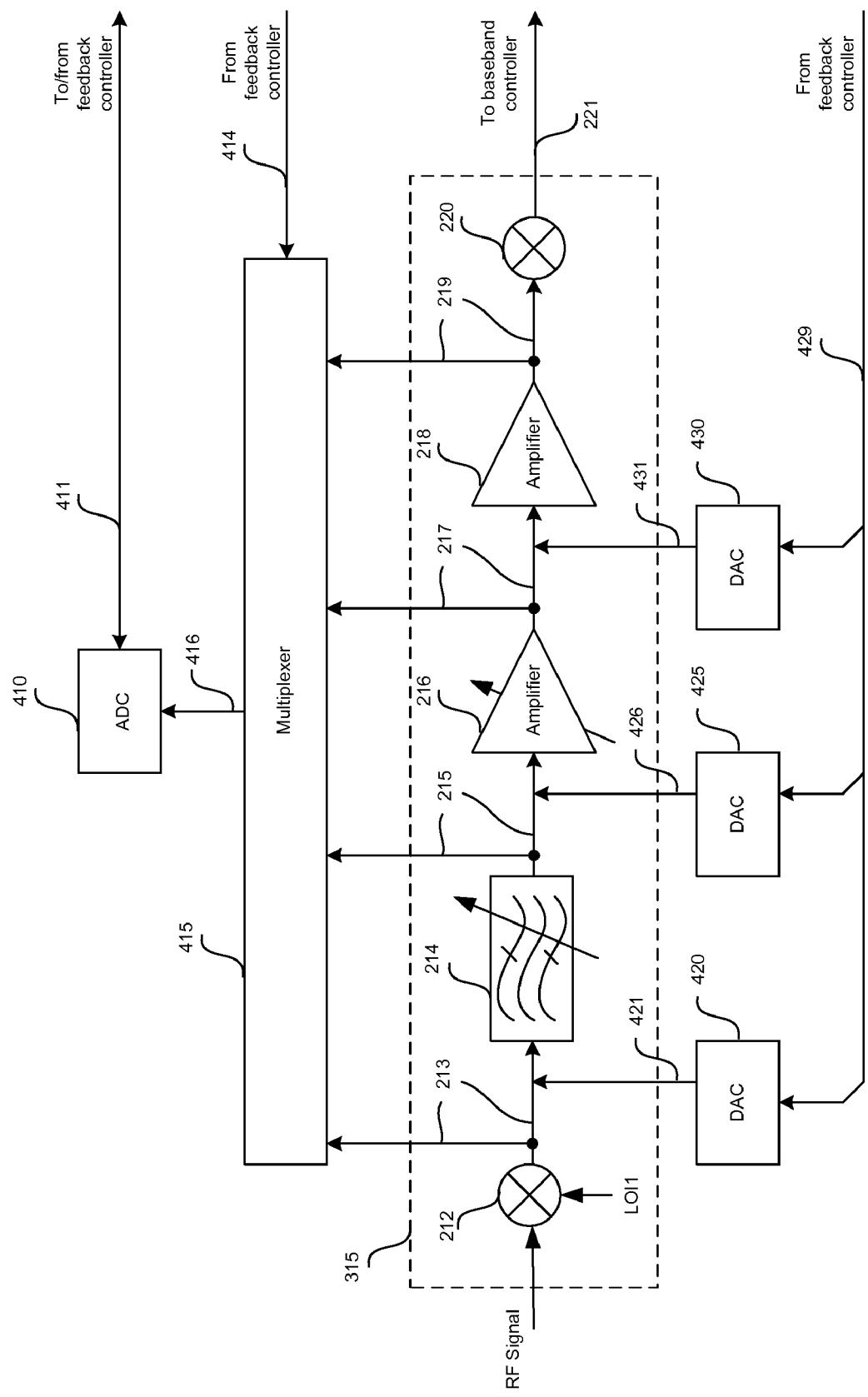
FIG. 4 is a block diagram illustrating an exemplary feedback system for an I-channel baseband extractor, in accordance with an embodiment of the invention.

FIG. 4 is a block diagram illustrating an exemplary feedback system for an I-channel baseband extractor, in accordance with an embodiment of the invention. Referring to FIG. 4, there is shown an analog-to-digital converter (ADC) 410, a multiplexer 415, an ICBE 315, and digital-to-analog converters (DACs) 420, 425 and 430. The ICBE 315 may be coupled to the multiplexer 415, which may be coupled to the ADC 410. The ICBE 315 may also be coupled to the DACs 420, 425 and 430. The ADC 410 may be coupled to the feedback controller 330 (FIG. 3), which may also be coupled to the DACs 420, 425 and 430. The ICBE 415 may be coupled to the baseband processor 305 (FIG. 3).

The ADC 410 may comprise suitable logic, circuitry, and/or code that may be adapted to convert an analog signal sample to a digital value, for example, 8 bit word, 16 bit word, 24 bit word, or 32 bit word. Converting a plurality of analog signal samples may generate a digital signal equivalent of the analog signal, and the digital signal may be processed digitally, for example, by digital filters or digital signal processors (DSPs), to remove unwanted noise or downconvert to a lower frequency.

The multiplexer 415 may comprise suitable logic, circuitry, and/or code that may be adapted to receive a plurality of analog signals and select an input analog signal to transfer to an output of the multiplexer 415. The input analog signal to select as an output may be specified by control signals from, for example, a feedback controller 330 (FIG. 3). The ICBE 315, which may comprise mixers 212 and 220, a bandpass filter 214 and amplifiers 216 and 218, may function as described in FIG. 3. The DACs 420, 425, and 430 may comprise suitable logic, circuitry, and/or code that may be adapted to convert a digital value, for example, 8 bit word, 16 bit word, 24 bit word, or 32 bit word, to an analog signal. A single digital value may be converted to a DC signal which may be time-invariant, but a plurality of digital values that may have differing values may be converted to an analog signal in which the voltage and/or current may be time-variant.

In operation, an RF signal may be received by the mixer 212, and the mixer 212 may mix the RF signal with a local oscillator signal LOI1 to generate a mixed signal 213. The mixed signal 213 may be communicated to an input of the bandpass filter 214 and to a first of a plurality of inputs of the multiplexer 415. The bandpass filter 214 may amplify and/or filter the mixed signal 213 to generate a filtered signal 215. The filtered signal 215 may be communicated to a second of a plurality of inputs of the multiplexer 415 and to an input of the amplifier 216, which may amplify the filtered signal 215 and generate an amplified signal 217. The amplified signal 217 may be communicated to a third of a plurality of inputs of the multiplexer 415 and to an input of the amplifier 218, which may further amplify the amplified signal 217 to generate an amplified signal 219. The amplified signal 219 may be communicated to a fourth of a plurality of inputs of the multiplexer 415 and to an input of the mixer 220. The mixer 220 may mix the amplified signal 219 with a local oscillator signal LOI2 to generate an I-channel analog baseband signal 221, which may be communicated to, for example, a baseband processor 305 (FIG. 3) for further processing to extract voice and/or data information.

At least one control signal 414 from a processor, for example, the baseband processor 305, and/or a feedback controller 330 (FIG. 3), may be utilized to select an input signal to the multiplexer 415 to transfer as multiplexed signal 416 at an output terminal of the multiplexer 415. The multiplexed signal 416 may be communicated to the ADC 410, and the ADC 410 may convert the multiplexed signal 416 to a digital sample when indicated by the feedback controller 330. The digital sample may be communicated to a feedback controller 330 via data/control signal 411, and the feedback controller 330 may process the digital sample to generate a digital feedback value. The digital feedback value may be communicated to at least one of a plurality of DACs 420, 425 and 430 via control/data signals 429. The feedback controller 330 may also communicate commands, via control/data signals 429, to a DAC or DACs selected to convert the digital feedback value to an analog feedback signal 421, 426, or 431.

The analog feedback signals 421, 426 and 431 may be fed back to the input of the bandpass filter 214, the input of the amplifier 216, and to the input of the amplifier 218, respectively. The analog feedback signal 421 may add to the mixed signal 213, the analog feedback signal 426 may add to the filtered signal 215, and the analog feedback signal 431 may add to the amplified signal 217 such that the DC offsets may be reduced in the resulting added signals.

Figure 5:
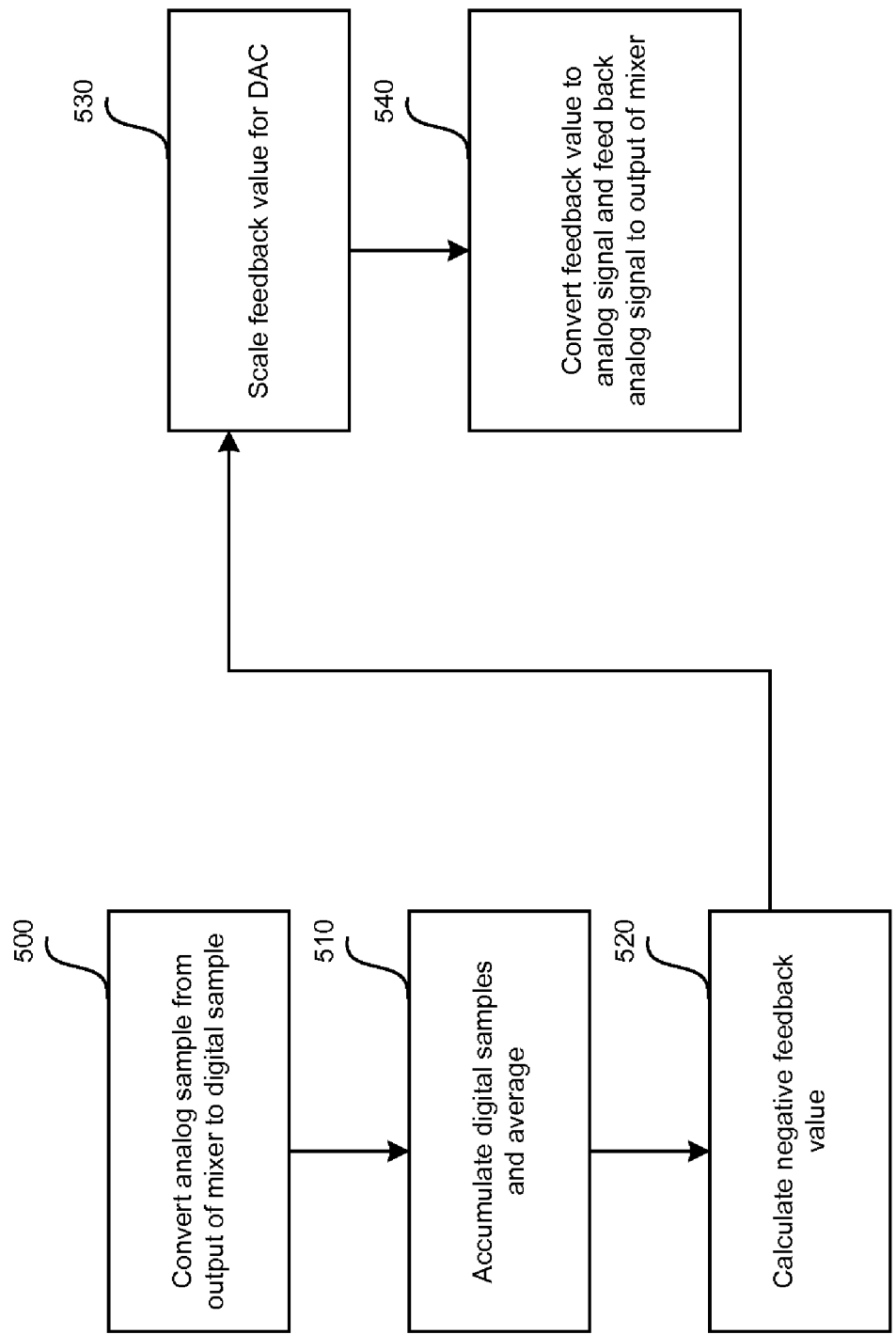
FIG. 5 is an exemplary flow diagram of an exemplary open-loop feedback system, in accordance with an embodiment of the invention.

FIG. 5 is an exemplary flow diagram of an exemplary open-loop feedback system, in accordance with an embodiment of the invention. In step 500, analog samples from an output of the mixers may be converted to digital samples. In step 510, the digital samples may be accumulated and averaged. In step 520, a negative feedback value may be calculated. In step 530, the calculated negative feedback value may be scaled for the digital-to-analog conversion. In step 540, the scaled negative feedback value may be converted to an analog signal and the analog signal may be fed back to the output of the mixers.

Referring to FIGS. 2, 4 and 5, the exemplary steps 500 to 540 that may be utilized to implement the open-loop feedback to reduce DC offset at input of bandpass filter 214 (FIG. 4). Accordingly, in step 500, the multiplexer 415 (FIG. 4) may be utilized to select the mixed signal 213 (FIG. 4) as an output signal. The ADC 410 (FIG. 4) may sample the output signal of the multiplexer 415 and convert the sample to a digital sample, which may be communicated to the feedback controller 330 (FIG. 3). In step 510, the feedback controller 330 may accumulate a plurality of the digital samples from the ADC 410 and calculate an average value. In step 520, the feedback controller 330 may calculate a negative feedback value from the average value. In step 530, the negative feedback value may be scaled for a specific DAC that may be utilized to convert the negative feedback value to an analog feedback signal. In step 540, the negative feedback value may be communicated to DAC 420 (FIG. 4), which may convert the negative feedback value to an analog feedback signal 421 (FIG. 4). The analog feedback signal 421 may be added to the mixed signal 213 to reduce DC offset at input of bandpass filter 214.

At least one open-loop feedback of steps 500 to 540 may occur per received packet, wherein the received packet may comprise header information and data. The packet may be transmitted by the transmitter block 110 (FIG. 1a) and received by the receiver block 120 (FIG. 1a). The open loop feedback may be considered a "coarse" adjustment of DC offset in the received packet.

Figure 6:
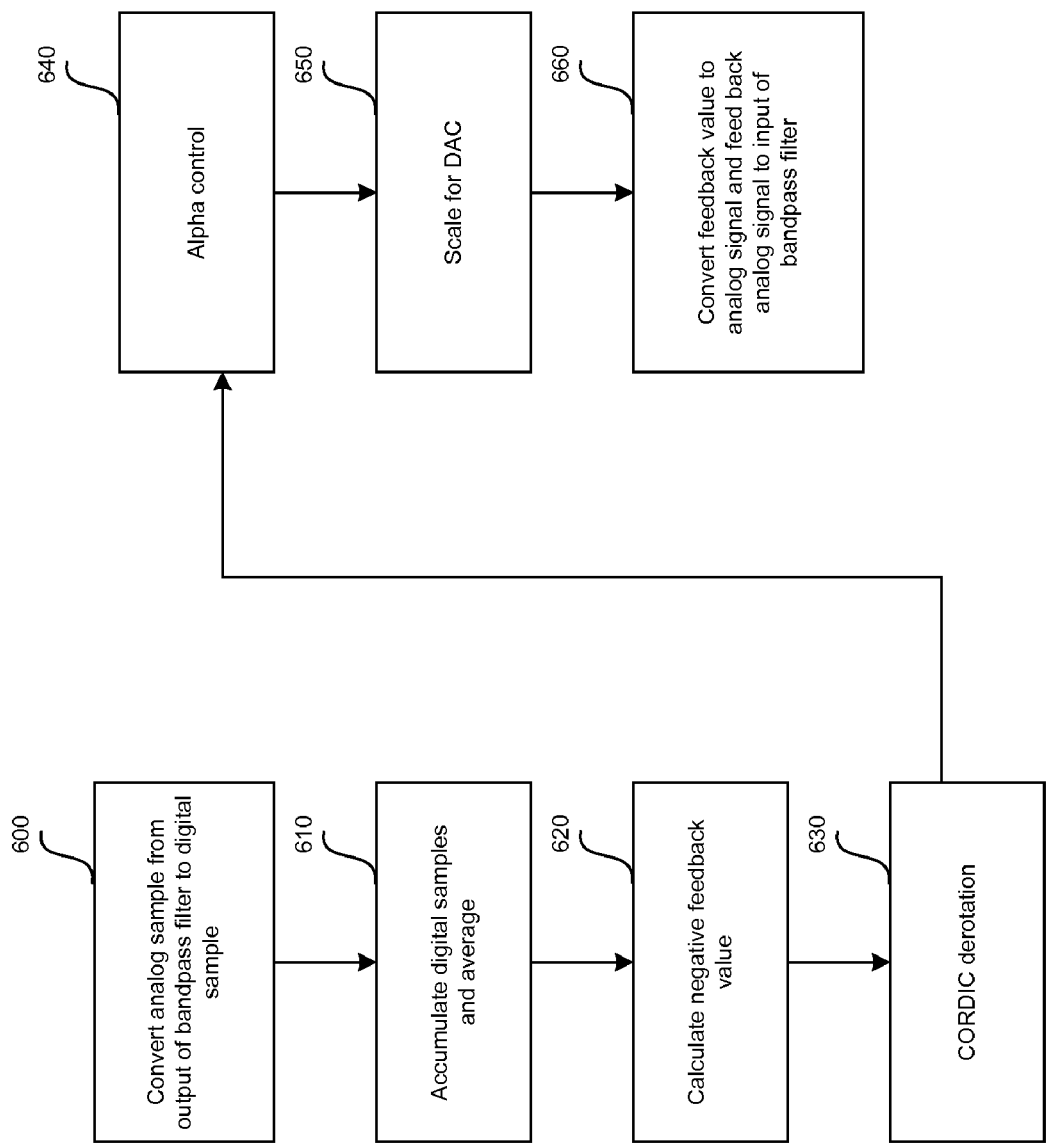
FIG. 6 is an exemplary flow diagram of an exemplary closed-loop feedback system with derotation, in accordance with an embodiment of the invention.

FIG. 6 is an exemplary flow diagram of an exemplary closed-loop feedback system with derotation, in accordance with an embodiment of the invention. In step 600, analog samples from outputs of the bandpass filters may be converted to digital samples. In step 610, the digital samples may be accumulated and averaged. In step 620, a negative feedback value may be calculated based on the accumulated digital value average. In step 630, coordinate rotation digital computer (CORDIC) derotation may be done and in step 640, alpha control of the feedback may be done. In step 650, the resulting digital values may be scaled for digital-to-analog conversion. In step 660, the digital values may be converted to an analog signal, which may be fed back to an input of the bandpass filter.

In step 630, CORDIC derotation may remove undesired phase shifts from a desired signal, where the phase shifts may have been introduced by interfering signals. For example, the output of the mixer 212 (FIG. 4) may comprise the desired IF I component signal, as well as the undesired IF Q component signal. The IF Q component signal may introduce an undesired phase shift in the IF I component signal. Accordingly, CORDIC derotation may remove the undesired phase shift in the IF I component signal, either partially or totally. In step 640, during alpha control of the feedback, the gain of the bandpass filter may be considered such that the feedback signal may be attenuated appropriately.

Referring to FIGS. 3, 4 and 6, there is shown a plurality of steps 600 to 660 that may be utilized to implement a closed-loop feedback with derotation to reduce DC offset at input of bandpass filter 216 (FIG. 4). In step 600, multiplexer 415 (FIG. 4) may select filtered signal 215 (FIG. 4) as an output signal. The ADC 410 (FIG. 4) may sample the output signal of the multiplexer 415 and convert the sample to a digital sample, which may be communicated to feedback controller 330 (FIG. 3). In step 610, the feedback controller 330 may accumulate a plurality of the digital samples from the ADC 410 and calculate an average. In step 620, the feedback controller 330 may calculate a desired negative feedback value from the average. In step 630, the phase of the negative feedback value may be adjusted by using an algorithm, for example, a CORDIC algorithm. In step 640, alpha control of the derotated negative feedback signal may adjust for amplification by the bandpass filter 214. In step 650, the result of step 640 may be scaled for a specific DAC that may be utilized to convert the negative feedback value to an analog feedback signal. In step 660, the negative feedback value may be communicated to DAC 420 (FIG. 4), which may convert the negative feedback value to an analog feedback signal 421. The analog feedback signal 421 may be added to the mixed signal 213 (FIG. 4) to reduce DC offset at input of the bandpass filter 214.

A plurality of closed-loop feedback of steps 600 to 660 may occur per received packet, wherein the received packet may comprise header information and data. The packet may be transmitted by the transmitter block 110 (FIG. 1a) and received by the receiver block 120 (FIG. 1a). The closed loop feedback may be considered a "fine" adjustment of DC offset in the received packet.

Figure 7:
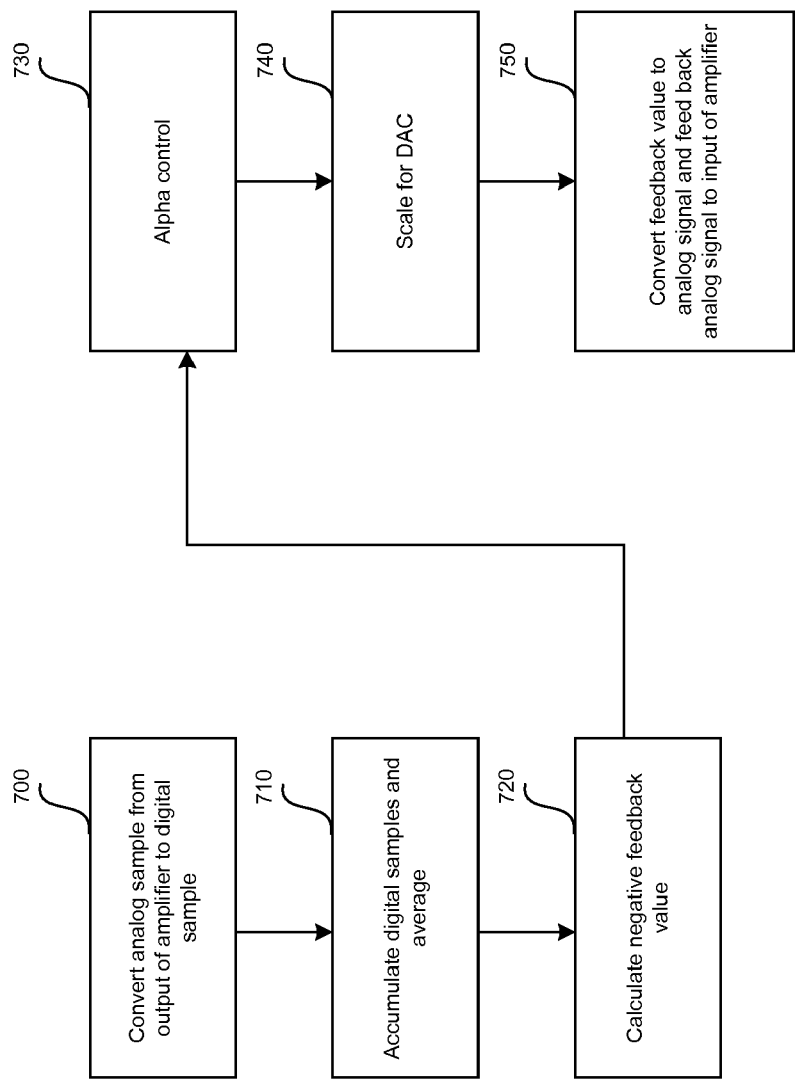
FIG. 7 is an exemplary flow diagram of an exemplary closed-loop feedback system without derotation, in accordance with an embodiment of the invention.

FIG. 7 is an exemplary flow diagram of an exemplary closed-loop feedback system without derotation, in accordance with an embodiment of the invention. In step 700, analog samples from outputs of the bandpass filters may be converted to digital samples. In step 710, the digital samples may be accumulated and averaged. In step 720, a negative feedback value may be calculated based on the average. In step 730, alpha control of the feedback value may be done and in 740, the resulting feedback values may be scaled for digital-to-analog conversion. In step 750, the feedback values may be converted to an analog signal, which may be fed back to an input of the amplifier.

Referring to FIGS. 2, 4 and 7, there is shown a plurality of steps 700 to 750 that may be utilized to implement a closed-loop feedback to reduce DC offset at input of amplifier 216 (FIG. 4). In step 700, multiplexer 415 (FIG. 4) may select amplified signal 217 (FIG. 4) as an output signal. The ADC 410 (FIG. 4) may sample the output signal of the multiplexer 415 and convert the analog sample to a digital sample, which may be communicated to feedback controller 330 (FIG. 3). In step 710, the feedback controller 330 may accumulate a plurality of the digital samples from the ADC 410 and calculate an average. In step 720, the feedback controller 330 may calculate a desired negative feedback value from the average. In step 730, alpha control of the negative feedback signal may adjust for amplification by the amplifier 216 (FIG. 4). In step 740, the result of step 730 may be scaled for a specific DAC that may be utilized to convert the negative feedback value to an analog feedback signal. In step 750, the negative feedback value may be communicated to DAC 425 (FIG. 4), which may convert the negative feedback value to an analog feedback signal 426 (FIG. 4). The analog feedback signal 426 may be added to the amplified signal 215 (FIG. 4) to reduce DC offset at input of amplifier 216.

FIG. 7, may similarly describe closed-loop feedback to reduce DC offset at input of amplifier 218 (FIG. 4). In step 700, multiplexer 415 (FIG. 4) may select amplified signal 219 (FIG. 4) as an output signal. The ADC 410 (FIG. 4) may sample the output signal of the multiplexer 415 and convert the sample to a digital value, which may be communicated to feedback controller 330 (FIG. 3). In step 710, the feedback controller 330 may accumulate a plurality of the digital values from the ADC 410 and calculate an average value. In step 720, the feedback controller 330 may calculate a desired negative feedback value from the average value. In step 730, alpha control of the derotated negative feedback signal may occur to adjust for amplification by the amplifier 218 (FIG. 4). In step 740, the result of step 730 may be scaled for a specific DAC that may be utilized to convert the negative feedback value to an analog feedback signal. In step 750, the negative feedback value may be communicated to DAC 430 (FIG. 4), which may convert the negative feedback value to an analog feedback signal 431 (FIG. 4). The analog feedback signal 431 may be added to the amplified signal 217 (FIG. 4) to reduce DC offset at input of amplifier 218.

A plurality of closed-loop feedback of steps 700 to 750 may occur per received packet, wherein the received packet may comprise header information and data. The packet may be transmitted by the transmitter block 110 (FIG. 1a) and received by the receiver block 120 (FIG. 1a). The closed loop feedback may be considered a "fine" adjustment of DC offset in the received packet.

Although specific feedback paths may have been described with regard to FIGS. 5-7, the invention need not be so limited. Accordingly, any of signals 213, 215, 217 and 219 (FIG. 4) may be sampled and feedback signals may be calculated and fed back to any of DACs 420, 425, and 430 (FIG. 4). Additionally, the feedback controller 330 may be programmable by a processor, for example, baseband processor 134 (FIG. 1b), processor/controller 136, or an external processor, to change a sample rate of the ADC 410. Changing the sample rate of the ADC 410 may change a number of feedback signals for adjusting the DC offset for each received packet, and the sample rate may depend on performance requirements. Furthermore, although the feedback controller 330 (FIG. 3) may be described as controlling feedback loops, another processor, for example, the processor/controller 136 (FIG. 1b), may be adapted to control the feedback loops.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments failing within the scope of the appended claims.

What is claimed is:

1. A method for processing signals, the method comprising:

in an RF receiver:
converting one or more analog samples, which are selected from one of a plurality of output paths of said RF receiver, to one or more digital samples;
generating a digital feedback value based on an average of said one or more converted digital samples;
converting a scaled version of said generated digital feedback value to an analog value; and
feeding back said converted analog value to one or more of a plurality of input paths of said RF receiver.

2. The method according to claim 1, comprising selecting said one or more analog samples from among a plurality of output analog samples from said plurality of output paths of said RF receiver.

3. The method according to claim 1, comprising communicating said one or more analog samples to an analog to digital converter to enable said conversion of said one or more analog samples to said one or more digital samples.

4. The method according to claim 1, comprising calculating said average of said converted one or more digital samples.

5. The method according to claim 1, comprising generating a digital feedback value based on said average of said one or more digital samples.

6. The method according to claim 1, comprising scaling said generated digital feedback value to generate said scaled version of said generated digital feedback value.

7. The method according to claim 6, comprising communicating said scaled generated digital feedback value to one or more digital-to-analog converters to enable said conversion of said scaled version of said generated digital feedback value to an analog value.

8. The method according to claim 6, comprising adjusting a gain of said scaled version of said generated digital feedback value.

9. The method according to claim 1, comprising adjusting a phase of said generated digital feedback value.

10. The method according to claim 9, comprising configuring a derotator for said adjusting of said phase of said generated digital feedback value.

11. The method according to claim 10, wherein said derotator utilizes a coordinate rotation digital computer (CORDIC) algorithm.

12. A system for processing signals, the system comprising:

one or more circuits for use in an RF receiver, wherein said one or more circuits are operable to:
convert one or more analog samples, which are selected from one of a plurality of output paths of said RF receiver, to one or more digital samples;
generate a digital feedback value based on an average of said one or more converted digital samples;
convert a scaled version of said generated digital feedback value to an analog value; and
feed back said converted analog value to one or more of a plurality of input paths of said RF receiver.

13. The system according to claim 12, wherein said one or more circuits are operable to select said one or more analog samples from among a plurality of output analog samples from said plurality of output paths of said RF receiver.

14. The system according to claim 12, wherein said one or more circuits are operable to communicate said one or more analog samples to an analog to digital converter to enable said conversion of said one or more analog samples to said one or more digital samples.

15. The system according to claim 12, wherein said one or more circuits are operable to calculate said average of said converted one or more digital samples.

16. The system according to claim 12, wherein said one or more circuits are operable to generate a digital feedback value based on said average of said one or more digital samples.

17. The system according to claim 12, wherein said one or more circuits are operable to scale said generated digital feedback value to generate said scaled version of said generated digital feedback value.

18. The system according to claim 17, wherein said one or more circuits are operable to communicate said scaled generated digital feedback value to one or more digital-to-analog converters to enable said conversion of said scaled version of said generated digital feedback value to an analog value.

19. The system according to claim 17, wherein said one or more circuits are operable to adjust a gain of said scaled version of said generated digital feedback value.

20. The system according to claim 12, wherein said one or more circuits are operable to adjust a phase of said generated digital feedback value.

21. The system according to claim 20, wherein said one or more circuits comprise a derotator, and said one or more circuits are operable to configure said derotator for said adjustment of said phase of said generated digital feedback value.

22. The system according to claim 21, wherein said derotator utilizes a coordinate rotation digital computer (CORDIC) algorithm.

* * * * *